(12) United States Patent
Hall et al.

(10) Patent No.: US 7,130,761 B2
(45) Date of Patent: Oct. 31, 2006

(54) UNCERTAINTY PROPAGATION SYSTEM AND METHOD

(75) Inventors: Blair Durham Hall, Waikanae (NZ); Robin Daniel Willink, Wellington (NZ)

(73) Assignee: Industrial Research Limited, Lower Hutt (NZ)

( * ) Notice: Subject to any disclaimer, the term of this patent is extended or adjusted under 35 U.S.C. 154(b) by 0 days.

(21) Appl. No.: 10/479,676

(22) PCT Filed: Jun. 6, 2002

(86) PCT No.: PCT/NZ02/00107

§ 371 (c)(1),
(2), (4) Date: Jul. 15, 2004

(87) PCT Pub. No.: WO02/099361

PCT Pub. Date: Dec. 12, 2002

(65) Prior Publication Data

US 2004/0260526 A1   Dec. 23, 2004

(30) Foreign Application Priority Data

Jun. 6, 2001    (NZ) .................................... 512212
Apr. 24, 2002   (NZ) .................................... 518573

(51) Int. Cl.
    *G06F 15/18*    (2006.01)
(52) U.S. Cl. .......................... 702/181; 706/21; 706/22; 706/25; 702/67
(58) Field of Classification Search ...................... None
    See application file for complete search history.

(56) References Cited

U.S. PATENT DOCUMENTS

| | | | |
|---|---|---|---|
| 4,217,651 A | 8/1980 | Pickering | |
| 4,864,512 A * | 9/1989 | Coulson et al. | 702/67 |
| 5,576,979 A | 11/1996 | Lewis et al. | |
| 6,353,815 B1 * | 3/2002 | Vilim et al. | 706/15 |
| 6,490,698 B1 * | 12/2002 | Horvitz et al. | 714/46 |
| 6,516,040 B1 * | 2/2003 | Lecourtier et al. | 375/356 |
| 6,560,275 B1 * | 5/2003 | Lecourtier et al. | 375/220 |
| 6,591,254 B1 * | 7/2003 | Keeler et al. | 706/21 |
| 6,611,739 B1 * | 8/2003 | Harvey et al. | 701/29 |
| 6,714,925 B1 * | 3/2004 | Barnhill et al. | 706/48 |
| 6,782,372 B1 * | 8/2004 | Cooper et al. | 706/8 |
| 6,810,332 B1 * | 10/2004 | Harrison | 702/13 |
| 2001/0034589 A1 * | 10/2001 | Lee et al. | 703/2 |
| 2002/0091655 A1 * | 7/2002 | Agrafiotis et al. | 706/26 |
| 2004/0086174 A1 * | 5/2004 | Sun | 382/154 |
| 2004/0133533 A1 * | 7/2004 | Keeler et al. | 706/21 |
| 2005/0004833 A1 * | 1/2005 | McRae et al. | 705/11 |

(Continued)

OTHER PUBLICATIONS

K.O. Arras, "An Introduction To Error Propagation: Derivation, Meaning and Examples of Equation $C_y = F_x C_x F_x^T$", Tech. Report EPFL, (Sep. 1998).

(Continued)

*Primary Examiner*—Carol S. W. Tsai
(74) *Attorney, Agent, or Firm*—Dann, Dorfman, Herrell and Skillman, P.C.

(57) ABSTRACT

The invention provides a method of calculating uncertainty in the system represented as two or more modules comprising the steps of passing uncertainty information from each module to at least one further module; and calculating uncertainty in the measurement result from the information exchanged between the modules. The invention also provides a method of propagating uncertainty in a measurement system and also provides related systems for calculating uncertainty and propagating uncertainty.

8 Claims, 10 Drawing Sheets

U.S. PATENT DOCUMENTS

2005/0004969 A1* 1/2005 McRae et al. .............. 709/200

OTHER PUBLICATIONS

J.M. Seitzman, "Experimental Errors and Uncertainty: An Introduction" (Jan. 2001).

B. Anderson, Keynote Address, Annual NCSLI Conference, published by Agilent Technologies (Sep. 2001).

D. Abell et al., "Meeting ISO 17025 Requirements for Complex Electronic Test Equipment", 2002 NCSLI Intl. Workshop and Symposium.

B.D. Hall, "Calculating measurement uncertainty with reverse automatic differentiation", Industrial Research Limited Internal Report 1041 (Aug. 2001).

B.D. Hall, "Automatic uncertainty calculation for measurement systems" (Oct. 2001).

B.D. Hall et al., "Automatic uncertainty calculation for smart measurement system", SIcon '01 Sensors for Industry Conference, Rosemount, IL (Nov. 2002).

B.D. Hall, "Calculating uncertainty automatically in instrumentation systems", Industrial Research Limited Internal Report 1073 (Feb. 2002).

* cited by examiner

UNCERTAINTY PROPAGATION SYSTEM AND METHOD

FIELD OF INVENTION

The invention relates to a methodology, particularly but not solely intended to allow propagation of measurement uncertainty information in a system consisting of interconnected modules, each of which may contribute to the uncertainty of the measurement result in some way. If the measurement result is a scalar (or one-dimensional) quantity then this uncertainty is expressible as a 'standard uncertainty', which is understood to be the standard deviation of the statistical distribution associated with the measurement result. If the measurement result is a vector (or multidimensional) quantity then this uncertainty is expressible as the variance-covariance matrix of the multidimensional statistical distribution associated with the measurement result.

BACKGROUND TO INVENTION

There are currently many ways to improve the design and performance of measurement systems, and systems components. Such improvements may lead to increased system reliability and flexibility, lower costs of installation and ongoing ownership, easier maintenance, repair and upgrading.

It is generally accepted that measurement results must be qualified with statements of uncertainty. In fact, the correct calculation and reporting of uncertainties is needed to achieve traceability of measurement results. Such calculation and reporting is an issue for national metrology institutes as well as for accredited calibration laboratories. Correct manipulation of uncertainties may also be a requirement for ISO 9000 certification of some organisations.

It would be particularly desirable for measurement systems to be able to determine the uncertainty in any measurement result automatically by using data from the uncertainties associated with individual sub-systems and transducers.

SUMMARY OF INVENTION

In one form the invention comprises a method of calculating uncertainty in the measurement result of a measurement system represented as two or more modules comprising the steps of passing uncertainty information from each module to at least one further module; and calculating uncertainty in the measurement result from the information exchanged between the modules.

In another form the invention comprises an uncertainty calculation system comprising two or more modules representing a measurement system; the ability of each module to pass uncertainty information to at least one further module; and a calculating component configured to calculate uncertainty in the measurement system from the information exchanged between the modules.

In yet another form the invention comprises a method of propagating uncertainty in a measurement system represented by one or more modules comprising the steps of calculating within each module the uncertainty information appropriate to the quantity evaluated by that module; and providing access to this information for other modules.

In yet a further form the invention comprises an uncertainty propagation system comprising two or more modules representing a measurement system, where these modules are each configured to calculate the uncertainty information appropriate to the quantity evaluated by that module; and each configured to provide access to this information for other modules.

BRIEF DESCRIPTION OF THE FIGURES

Preferred forms of the uncertainty calculation system and method will now be described with reference to the accompanying figures in which.

DETAILED DESCRIPTION OF PREFERRED FORMS

The term 'module' as used in the specification is any part (or whole) of a measurement system that:

1) produces an output value that is a function of its input values, if such input values exist and
2) produces output values for the components of uncertainty in the function due to each input to the measurement system.

A system may, by its nature, be composed of identifiable modules, some of which may be reusable. Alternatively, a system can be decomposed into a network of modules, which represents a hierarchical series of intermediate calculation steps representing the evaluation of a measurement result, and its uncertainty. The degree to which decomposition proceeds is unimportant to the invention. The input-output relationship between all modules of a system can be represented as a directed network (directed acyclic graph).

In a first preferred form a measurement system is envisaged with n inputs. The inputs are regarded as the outputs of implicit modules labelled 1 to n. The system is then decomposed into (N−n) explicit modules labelled n+1 to N such that the module labelled 'N' is associated with the desired measurement result—both its value and uncertainty—and other modules are assigned labels which are always numerically greater than the labels of the modules associated with their inputs.

The function associated with the $i^{th}$ module i, (i=n+1, . . . ,N) is $x_i=f_i(\Lambda_i)$, where $\Lambda_i$ is defined as the set of inputs to module i (which are outputs from other modules) and $x_i$ is an output. In general, the elements of the set $\Lambda_i$ are other modules that are part of the decomposition network (but $\Lambda_i$ can also be the empty set).

A value for the measurement result ($x_N$) can be obtained from the network of modules by using the following recursive algorithm:

For i=n+1, n+2, ..., N, $$x_i = f_i(\Lambda_i). \quad (1)$$

Figure 1A:
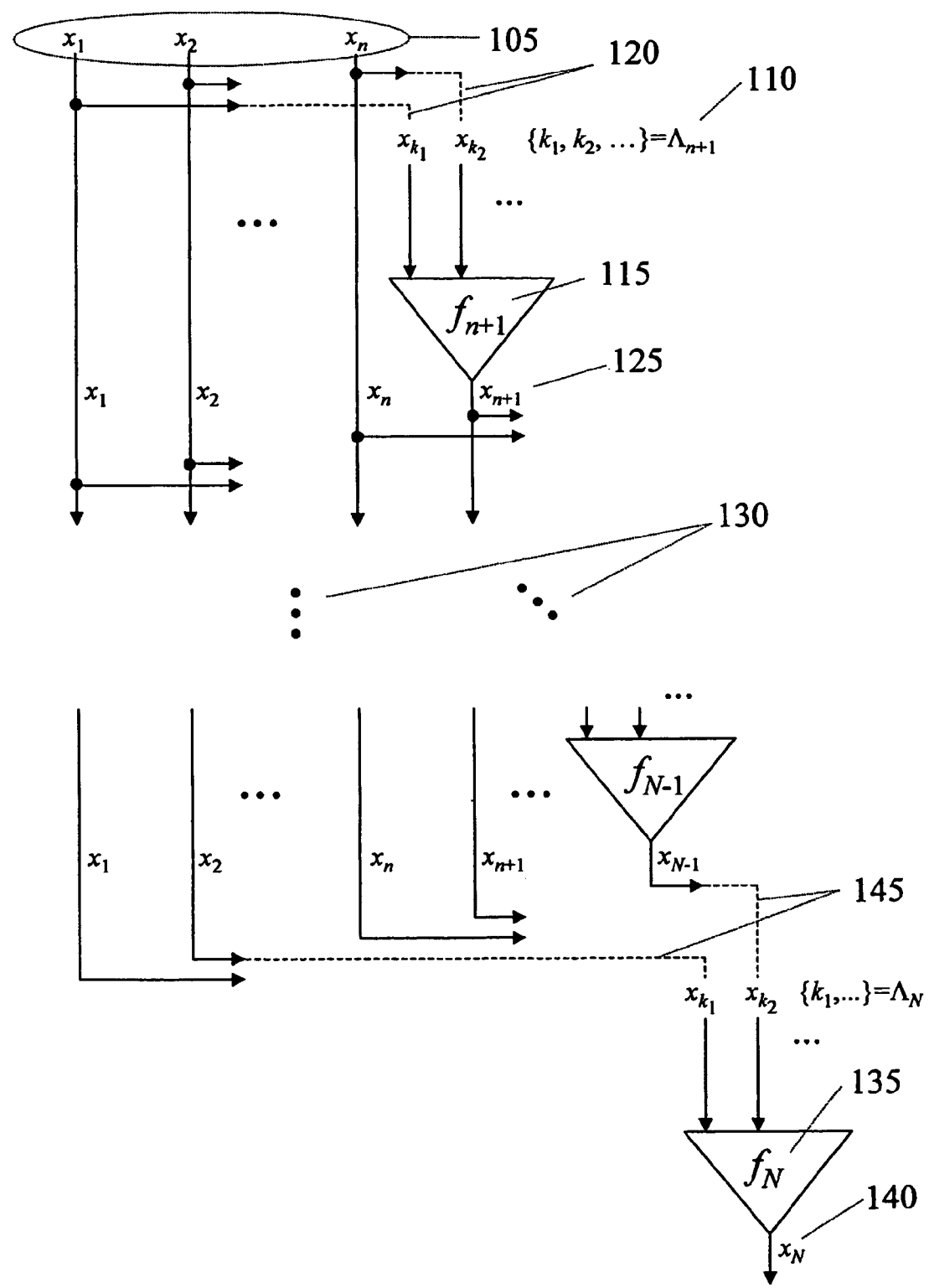
FIGS. 1A and 1B show a conceptual schematic representation of the algorithms on which the invention is based.

This algorithm is depicted in FIG. 1A. Some or all of the inputs 105 to the algorithm have indices contained in the set $\Lambda_{n+1}$, 110, which contains the indices of the inputs to the function $f_{n+1}$, 115. The dashed lines 120 represent an example where $x_1$ and $x_n$ are two of the inputs to this function. The output of this function 125 becomes an input to at least one function in a later step of the recursion. Iteration in the algorithm is symbolised by the large ellipses 130. The result of the function $f_N$ 135 at the last iteration is the measurement result $x_N$, 140. The dashed lines 145 represent an example where $x_2$ and $x_{N-1}$ are two of the inputs to this function.

The overall uncertainty in the measurement result, $x_N$, due to all contributions is denoted $u_N(x_N)$, and represents the standard deviation of the distribution associated with the measurement result. The value $u_N(x_N)$ can be calculated, when the inputs, $x_i$, are not correlated, using the function:

$$u_N^2(x_N) = \sum_{j=1}^{n} u_j^2(x_N) \quad (2)$$

where, for general p and q, we make the definition $$u_q(x_p) \equiv \frac{\partial x_p}{\partial x_q} u_q(x_q), \quad (3)$$

which is the component of standard uncertainty in $x_p$ attributable to any single quantity $x_q$. The quantity $u_q(x_q)$ is called the "standard uncertainty" of $x_q$, which is equal to the standard deviation of the distribution assigned to, or evaluated for, $x_q$. The partial derivative $\partial x_p/\partial x_q$, which is understood to be evaluated at the input values, is often called a "sensitivity coefficient". If none of the inputs to the pth module depend on $x_q$ then the partial derivative is zero.

The invention also provides an algorithm to calculate the partial derivatives and propagate uncertainty using the decomposition network. The component of standard uncertainty in $x_N$ associated with the input $x_j$, $u_j(x_N)$, where j=1,2, ..., n, is found, for given j, using the following recursive algorithm:

For $i = n+1, n+2, \ldots, N$ $$u_j(x_i) = \sum_{k \in \Lambda_i} \frac{\partial f_i(\Lambda_i)}{\partial x_k} u_j(x_k). \quad (4)$$

This algorithm is similar in structure to equation (1). The novelty of the invention in this preferred form is associated with this algorithm, which describes how uncertainty information may be propagated in a measurement system, in parallel to the calculation of the measurement result via equation (1).

Figure 1B:
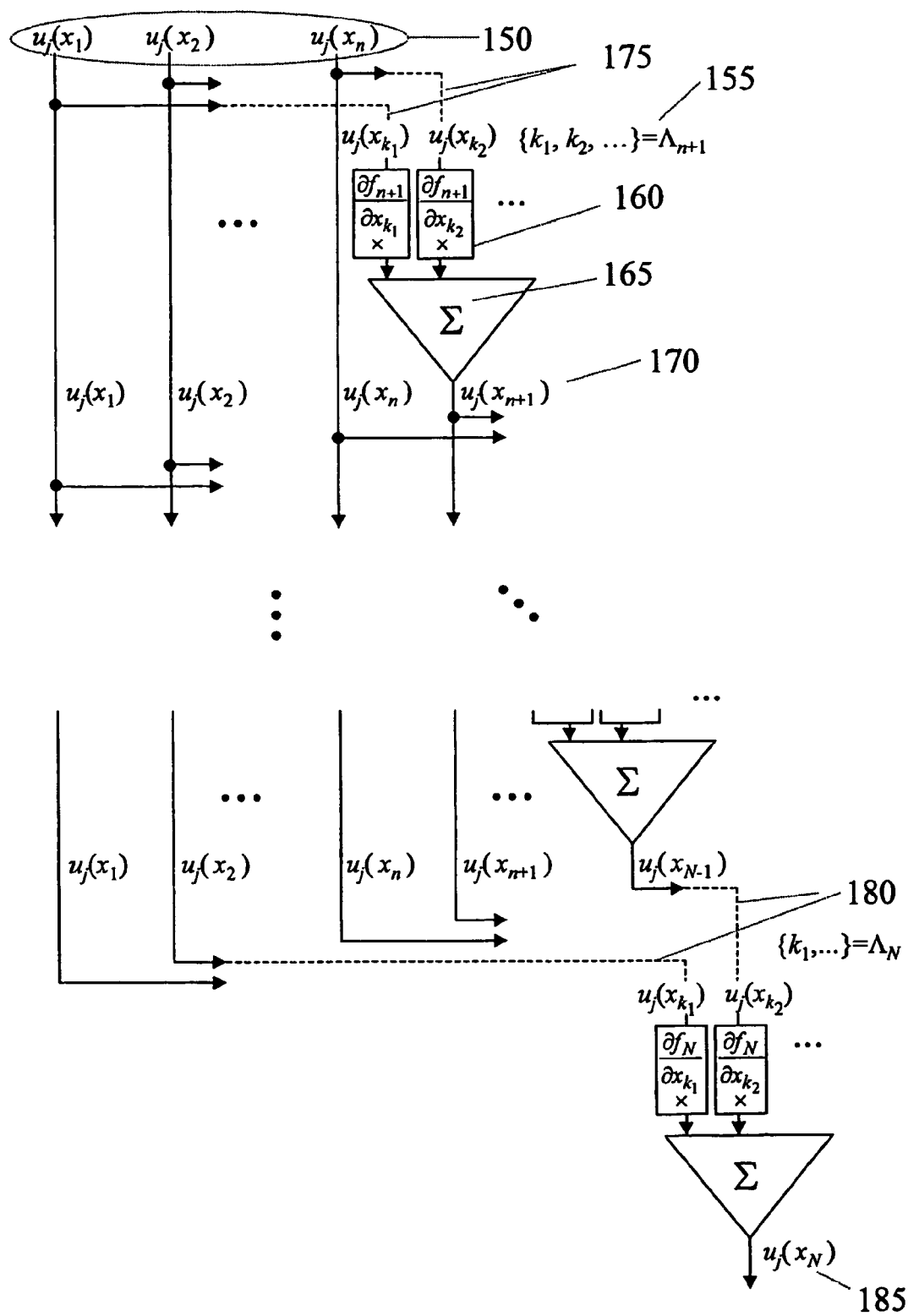

Algorithm (4) is depicted in FIG. 1B, for a single value of j. The algorithm takes as inputs the components of standard uncertainty in the system inputs associated with the jth system input, 150. In general $u_p(x_q)=0$ for $p,q \leq n$, $p \neq q$. The components for each input whose index is contained in the set $\Lambda_{n+1}$, 155, are (pre-)multiplied by the appropriate partial derivatives, 160, and are summed, 165. The output of the summation 170 becomes an input to at least one function in a later step of the recursion. The algorithm is iterative and follows exactly the same pattern of linkages as in FIG. 1A, so the dashed lines 175, 180 correspond to the same links as in FIG. 1A. The result of the summation at the last iteration is the component of the standard uncertainty in the measurement result $x_N$ due to the jth input, 185.

To implement the first algorithm (1), the $i^{th}$ module must provide an interface to output the value of $x_i$. To implement the second algorithm (4) this interface must also output values of $u_j(x_i)$ for j=1,2, ..., n.

Figure 2:
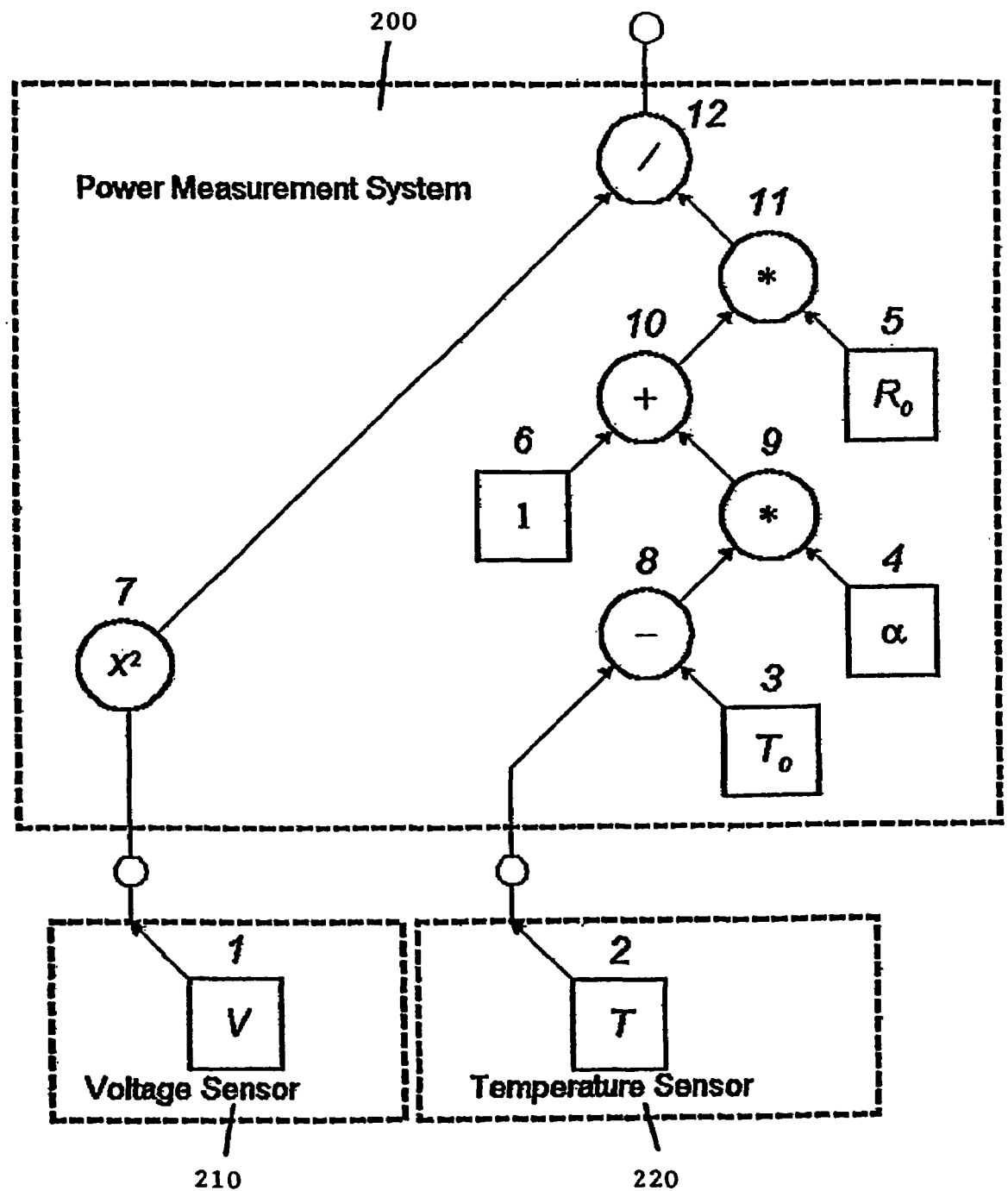
FIG. 2 shows the invention applied to a power measurement system.

FIG. 2 illustrates a second preferred form of the invention. The example relates to a power measurement system 200 with two associated sensors: one sensor for voltage, indicated at 210, and another sensor for temperature, indicated at 220. The system 100 together with sensors 210 and 220 is a module that has been decomposed into several connected modules shown as 1 through to 12. Modules 1, 2, 3, 4, and 5 are inputs: each has a value for the quantity represented and a standard uncertainty. The system for calculating a standard uncertainty for the value from these five input modules is described below.

The example illustrates the measurement of electrical power P by taking the voltage V across a calibrated resistor. Power is related to voltage by:

$$P = \frac{V^2}{R(T)}, \quad (5)$$

where the temperature dependent resistance is:

$$R(T) = R_0\{1 + \alpha[T-T_0]\}, \quad (6)$$

with $R_0$ representing the resistance value at temperature $T_0$. There are five "input quantities", V, T, $R_0$, $T_0$ and $\alpha$, which determine the value for P. It is assumed that V and T are measured and that the values for $R_0$, $T_0$ and $\alpha$ are calibration constants which have associated uncertainties. These uncertain input quantities must be assigned an appropriate distribution function. For instance, V might have a rectangular distribution, representing the digital resolution of an analog-to-digital converter, and T could have a Gaussian distribution.

In this case, the module associated with the combination of 200, 210 and 220 has a function:

$$P(V, T, R_0, T_0, \alpha) = \frac{V^2}{R_0\{1 + \alpha[T-T_0]\}}. \quad (7)$$

The best-estimate value of P can be calculated directly from equation (7) using best-estimate values of the inputs, but the uncertainty in P depends on the sensitivity to each of the input quantities.

FIG. 2 shows the relationship that exists between the modules of the power measurement system which applies to calculations of a power value, as well as its uncertainty.

Modules (shown as the nodes of the tree-like, directed acyclic graph, network) 1 through to 12 represent abstract data types that could be implemented by suitable structures in data memory and associated software functions. The input modules terminate branches of the network and represent measured quantities and calibration constants. Module 1 represents V, module 2 represents T, module 3 represents $T_0$, module 4 represents $\alpha$, and module 5 represents $R_0$. Other modules manipulate and merge data as part of the calculations. The figure uses arrows to indicate the input-output relationships between modules: an arrow leading from one module to another indicates that the 'pointed-to' module derives input from the other. Module 12, for example, gets input from modules 7 and 11, which in turn receive input from lower modules.

The calculation of a value for P can be broken down into the following equations (which will be evaluated in reverse order), each of which corresponds to the function associated with the module:

$$x_{12} = x_7/x_{11} \tag{8}$$

$$x_{11} = x_{10} * x_5 \tag{9}$$

$$x_{10} = x_6 + x_9 \tag{10}$$

$$x_9 = x_8 * x_4 \tag{11}$$

$$x_8 = x_2 - x_3 \tag{12}$$

$$x_7 = x_1^2 \tag{13}$$

The invention propagates the values of input quantities (modules 1 to 5) through the network, using the algorithm of equation (1). For example, the value for $x_8$ is calculated and then used to obtain a value for $x_9$, and so on.

The first-derivative calculations break down into the following equations. Each module in the figure is associated with two (sometimes only one) equations shown on the same line:

$$\frac{\partial x_{12}}{\partial x_7} = \frac{1}{x_{11}}; \quad \frac{\partial x_{12}}{\partial x_{11}} = -\frac{x_7}{x_{11}^2}; \tag{14}$$

$$\frac{\partial x_{11}}{\partial x_{10}} = x_5; \quad \frac{\partial x_{11}}{\partial x_5} = x_{10}; \tag{15}$$

$$\frac{\partial x_{10}}{\partial x_6} = 1; \quad \frac{\partial x_{10}}{\partial x_9} = 1; \tag{16}$$

$$\frac{\partial x_9}{\partial x_8} = x_4; \quad \frac{\partial x_9}{\partial x_4} = x_8; \tag{17}$$

$$\frac{\partial x_8}{\partial x_2} = 1; \quad \frac{\partial x_8}{\partial x_3} = -1; \tag{18}$$

$$\frac{\partial x_7}{\partial x_1} = 2x_1; \tag{19}$$

For example, the sensitivity of P to V can be found by $$\frac{\partial P}{\partial V} = \frac{\partial x_{12}}{\partial x_1} = \frac{\partial x_{12}}{\partial x_7}\frac{\partial x_7}{\partial x_1} + \frac{\partial x_{12}}{\partial x_{11}}\frac{\partial x_{11}}{\partial x_1}. \tag{20}$$

Because the right-hand branches of the network do not depend on module 1, the term $$\frac{\partial x_{11}}{\partial x_1},$$

which is part of the general expression for $$\frac{\partial x_{12}}{\partial x_1},$$

is zero. The factor $$\frac{\partial x_{12}}{\partial x_7}$$

depends only on the structure of module 12, so it can be evaluated by that module, similarly, the factor $$\frac{\partial x_7}{\partial x_1}$$

depends only on the structure of module 7. Clearly, the evaluation of $$\frac{\partial P}{\partial V}$$

can build up progressively by moving along the network from module 1 to module 12.

Now the uncertainty component in P due to V, $$u_1(x_{12}) = \frac{\partial x_{12}}{\partial x_1}u_1(x_1) = \frac{\partial x_{12}}{\partial x_7}u_1(x_7), \tag{21}$$

is built up by the network in steps:

$$u_1(x_{12}) = \frac{\partial x_{12}}{\partial x_7}\frac{\partial x_7}{\partial x_1}u_1(x_1) = \frac{1}{x_{11}} \cdot 2x_1 \cdot u_1(x_1) \tag{22}$$

It is easily verified that this corresponds to $$\frac{2V}{R_0\{1 + \alpha[T - T_0]\}}. \tag{23}$$

It will be appreciated that the calculation of power, P, and associated uncertainty is simply one implementation of the invention. It is envisaged that the invention could be implemented in any measurement system. It will be appreciated that where necessary, individual modules could be defined to accept any number of inputs, not merely the univariate and bivariate cases shown. In that case, the function associated with the modulewill not be as simple as the common unary and binary mathematical operations. For instance, the sub-network of modules 6, 8, 9, 10 and 11 could be replaced with a single module associated with the function $f(T,T_0,R_0,\alpha)$ $=R_0[1+\alpha(T-T_0)]$. This module accepts four inputs (from modules 2, 3, 4 and 5).

Figure 3:
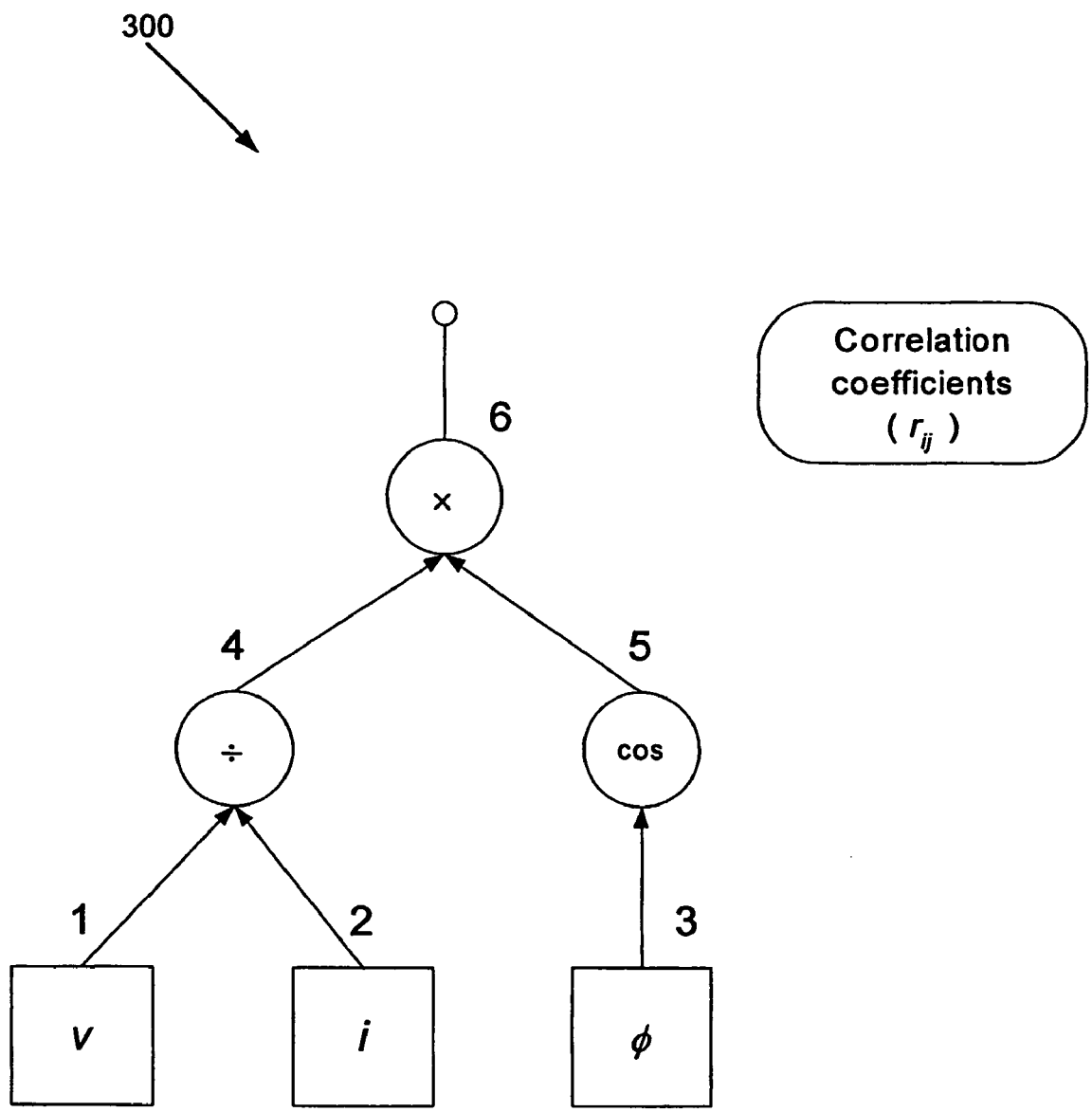
FIG. 3 shows the application of the invention used in the estimation of the resistive component of impedance of an electrical circuit element.

A third preferred form of the invention as shown in FIG. 3 illustrates the correct handling of correlation between input quantities. A measurement system is envisaged for the purpose of estimating the resistive component of impedance of an electrical circuit element. Measurements provide estimates of the voltage across the element of interest ($x_1$), the current through it ($x_2$), and the phase difference ($x_3$) between the potential difference and the current. The standard uncertainties for these estimates are $u_1(x_1)$, $u_2(x_2)$, and $u_3(x_3)$. In addition, the magnitude of correlation between these quantities has been estimated and is represented by the correlation coefficients $r_{12}$, $r_{23}$ and $r_{13}$ (values are symmetric, so $r_{12}$ equals $r_{21}$ etc).

The equation used to obtain an estimate of the resistance ($x_6$) is $$x_6 = \frac{x_1 \cos x_3}{x_2}. \tag{24}$$

This can be broken down into the intermediate-step modules as shown at 300:

$$x_6 = x_4 x_5; \tag{25}$$

$$x_5 = \cos x_3; \tag{26}$$

$$x_4 = x_1 / x_2. \tag{27}$$

and then equation (1) is applied.

The associated partial derivatives break down as $$\frac{\partial x_6}{\partial x_4} = x_5; \frac{\partial x_6}{\partial x_5} = x_4; \tag{28}$$

$$\frac{\partial x_5}{\partial x_3} = -\sin x_3; \tag{29}$$

$$\frac{\partial x_4}{\partial x_1} = \frac{1}{x_2}; \frac{\partial x_4}{\partial x_2} = -\frac{x_1}{x_2^2}. \tag{30}$$

and then equation (4) is applied.

So the three uncertainty components in $x_6$ are:

$$u_1(x_6) = \frac{\partial x_6}{\partial x_4}\frac{\partial x_4}{\partial x_1}u_1(x_1) = \frac{x_5}{x_2}u_1(x_1); \tag{31}$$

$$u_2(x_6) = \frac{\partial x_6}{\partial x_4}\frac{\partial x_4}{\partial x_2}u_2(x_2) = \frac{x_5 x_1}{x_2^2}u_2(x_2); \tag{32}$$

$$u_3(x_6) = \frac{\partial x_6}{\partial x_5}\frac{\partial x_5}{\partial x_3}u_3(x_3) = x_4 \sin x_3 u_3(x_3). \tag{33}$$

In cases where correlation exists between the inputs the standard uncertainty of the estimate of the resistance value is then calculated from the components using the equation $$u_{x_N}^2(x_N) = \sum_{i=1}^{n}\sum_{j=1}^{n} u_i(x_N) r_{ij} u_j(x_N) \tag{34}$$

instead of equation (2), to which equation (34) reduces when the inputs are uncorrelated.

A fourth preferred form of the invention extends the technique to measurement of an m-component quantity (vector).

A module function is defined in this preferred form as a vector function of the m-dimensional direct inputs to the module, returning an m-component value. The n module uncertainty components contributing to the uncertainty in the output are now m×m matrices. Vectors are assumed to be column vectors and are denoted in lowercase symbols with bold typeface; matrices are denoted in upper case symbols in bold typeface. When referring to a component of a vector quantity italic typeface is used and a second subscript identifies the component, e.g. the $k^{th}$ component of $x_1$ is denoted $x_{ki}$.

The decomposition of a system module again produces a network of intermediate modules $x_i$:$i=n+1, \ldots, N$ where each module function $x_i = f_i(\Lambda_i)$ is now a vector function and so consists of m functions for the components $x_{ki} = f_{ki}(\Lambda_i)$, $k=1, \ldots, m$. The evaluation of $x_N$ is analogous to equation (1):

For $i = n+1, \ldots, N$ $$x_i = f_i(\Lambda_i). \tag{35}$$

Figure 4A:
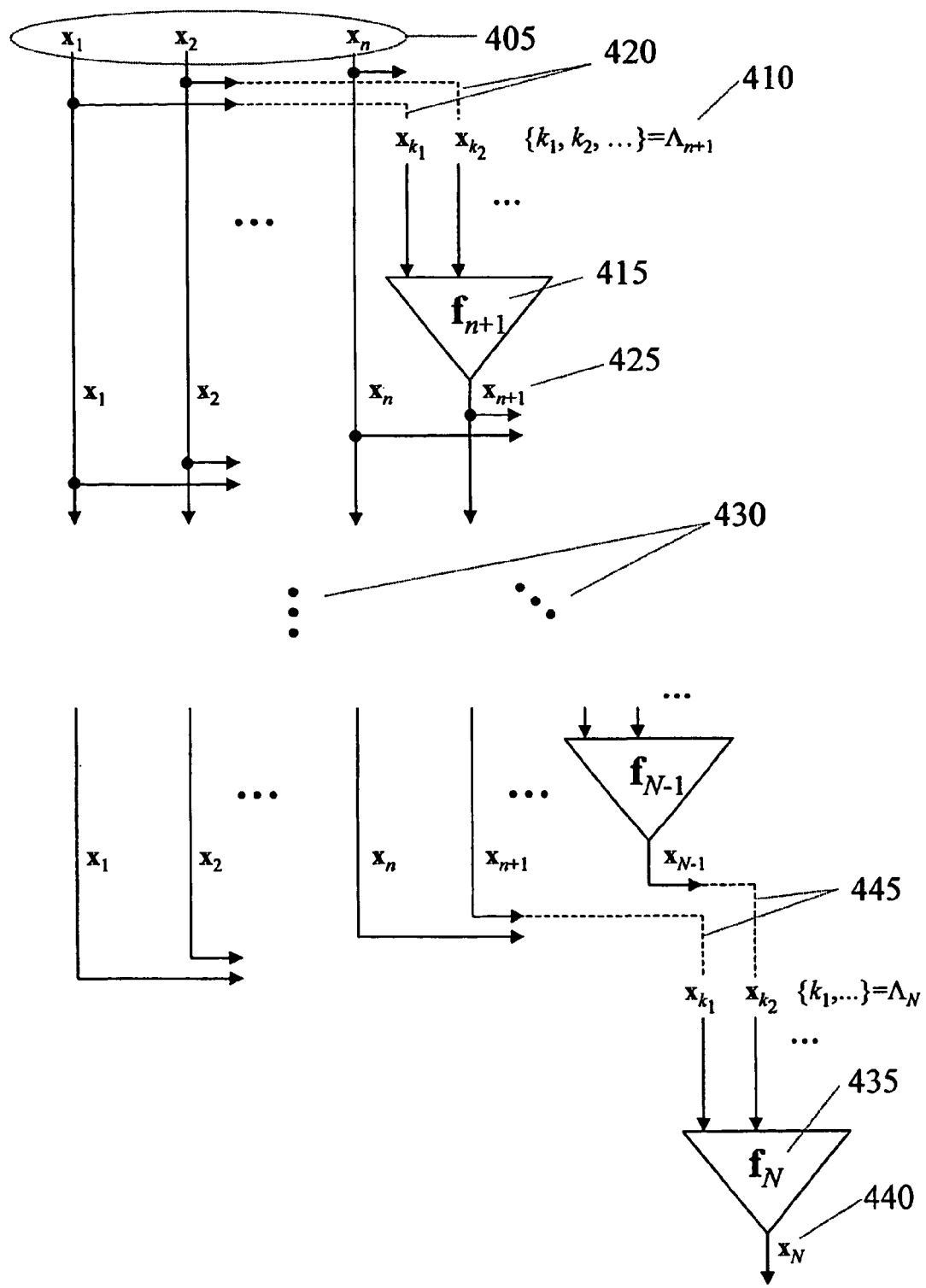
FIGS. 4A and 4B show a conceptual schematic representation of the algorithms on which the invention is based for an m-component quantity.

This algorithm is depicted in FIG. 4A. Some or all of the inputs 405 to the algorithm have indices contained in the set $\Lambda_{n+1}$, 410, which contains the indices of the inputs to the function $f_{n+1}$, 415. The dashed lines 420 represent an example where $x_1$ and $x_2$ are two of the inputs to this function. The multidimensional output of this function 425 becomes an input to at least one function in a later step of the recursion. Iteration in the algorithm is symbolised by the large ellipses 430. The result of the function $f_N$ 435 at the last iteration is the multidimensional measurement result $x_N$, 440. The dashed lines 445 represent an example where $x_{n+1}$ and $x_{N-1}$ are two of the inputs to this function.

For a particular module 'i', the uncertainty component matrix $U_j(x_i)$ is defined with respect to a system-input j as $$U_j(x_i) = \frac{\partial x_i}{\partial x'_j} U_j(x_j), \tag{36}$$

where $$\frac{\partial x_i}{\partial x'_j}$$

is a Jacobian matrix $$\frac{\partial x_i}{\partial x'_j} \equiv \begin{bmatrix} \frac{\partial x_{1i}}{\partial x_{1j}} & \frac{\partial x_{1i}}{\partial x_{2j}} & \cdots & \frac{\partial x_{1i}}{\partial x_{mj}} \\ \frac{\partial x_{2i}}{\partial x_{1j}} & \frac{\partial x_{2i}}{\partial x_{2j}} & \cdots & \frac{\partial x_{2i}}{\partial x_{mj}} \\ \vdots & \vdots & \ddots & \vdots \\ \frac{\partial x_{mi}}{\partial x_{1j}} & \frac{\partial x_{mi}}{\partial x_{2j}} & \cdots & \frac{\partial x_{mi}}{\partial x_{mj}} \end{bmatrix} \tag{37}$$

The uncertainty matrix of a system-input is diagonal, the terms being the standard (deviations) uncertainties of the input quantity's individual components, i.e.:

$$U_j(x_j) \equiv \begin{bmatrix} u_{1j}(x_{1j}) & 0 & \cdots & 0 \\ 0 & u_{2j}(x_{2j}) & \cdots & 0 \\ \vdots & \vdots & \ddots & \vdots \\ 0 & 0 & \cdots & u_{mj}(x_{mj}) \end{bmatrix} \quad (38)$$

To propagate uncertainty using the decomposition network the following algorithm can be used For $i=n+1, \ldots, N$, and for a particular $j$, $$U_i(x_i) = \sum_{k \in \Lambda_i} \frac{\partial f_i(\Lambda_i)}{\partial x'_k} U_j(x_k). \quad (39)$$

This algorithm is similar in structure to equation (35). The novelty of the invention in this preferred form is associated with this algorithm, which describes how uncertainty information may be propagated in a measurement system, in parallel to the calculation of the multidimensional measurement result via equation (35).

Figure 4B:
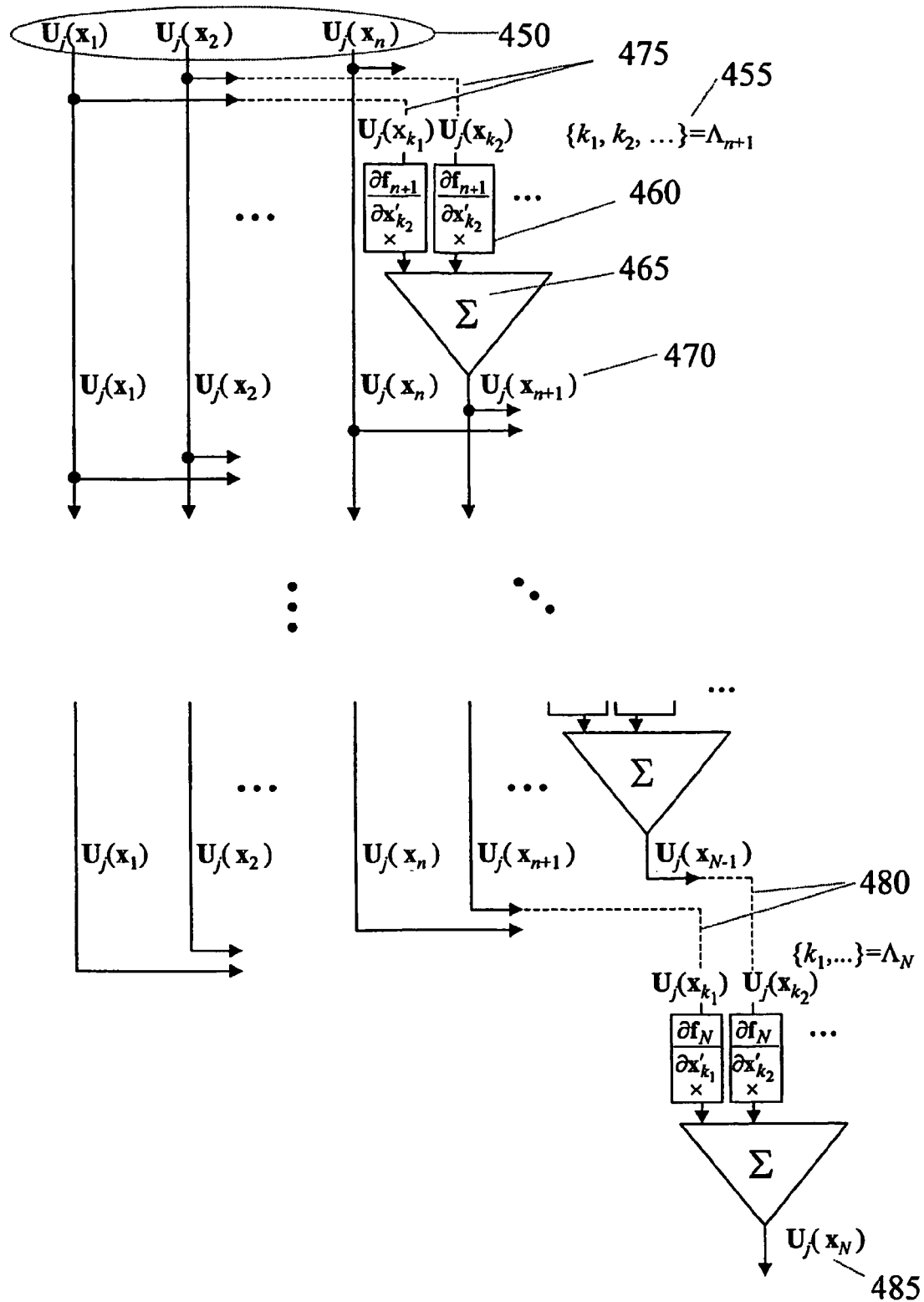

Algorithm (39) is depicted in FIG. 4B, for a single value of j. The algorithm takes as inputs 450 the components of the covariance matrix for the system inputs associated with the jth system input. In general $U_p(x_q)=0$ for $p,q \leq n$, $p \neq q$. The components for each input whose index is contained in the set $\Lambda_{n+1}$, 455, are pre-multiplied by the appropriate Jacobian matrices, 460, and are summed, 465. The output of the summation 470 becomes an input for use in at least one summation in a later step of the recursion. The algorithm is iterative and follows exactly the same pattern of linkages as in FIG. 4A, so the dashed lines 475, 480 correspond to the same links as in FIG. 4A. The result of the summation at the last iteration is the component of the covariance matrix for the measurement result $x_N$ due to the jth input, 480.

The component uncertainties can be assimilated into an $m \times nm$ matrix $U(x_i)$, which is composed, column-wise, of the n component matrices $$U(x_i) = [U_1(x_i) U_2(x_i) \ldots U_n(x_i)]. \quad (40)$$

The variance-covariance matrix of the system output is then obtained as the matrix product $$V(x_N) = U(x_N) R(x_1, x_2, \ldots, x_n) U(x_N)', \quad (41)$$

where the prime indicates the matrix transpose and the $mn \times mn$ correlation matrix $$R(x_1, x_2, \ldots, x_n) = \begin{bmatrix} r(x_{11}, x_{11}) & r(x_{11}, x_{21}) & \cdots & r(x_{11}, x_{mn}) \\ r(x_{21}, x_{11}) & r(x_{21}, x_{11}) & \cdots & r(x_{21}, x_{11}) \\ \vdots & \vdots & \ddots & \vdots \\ r(x_{nm}, x_{11}) & r(x_{nm}, x_{11}) & \cdots & r(x_{mn}, x_{mn}) \end{bmatrix} \quad (42)$$

has elements $r(x_{ij}, x_{ki})$ representing the correlation between the $i^{th}$ component of the input quantity $x_j$ and the $k^{th}$ component of the input quantity $x_i$. The diagonal elements of R are always unity, so if system input quantities are independent the calculation of the variance-covariance matrix can be simplified to $$V(x_N) = U(x_N) U(x_N)'. \quad (43)$$

Figure 5:
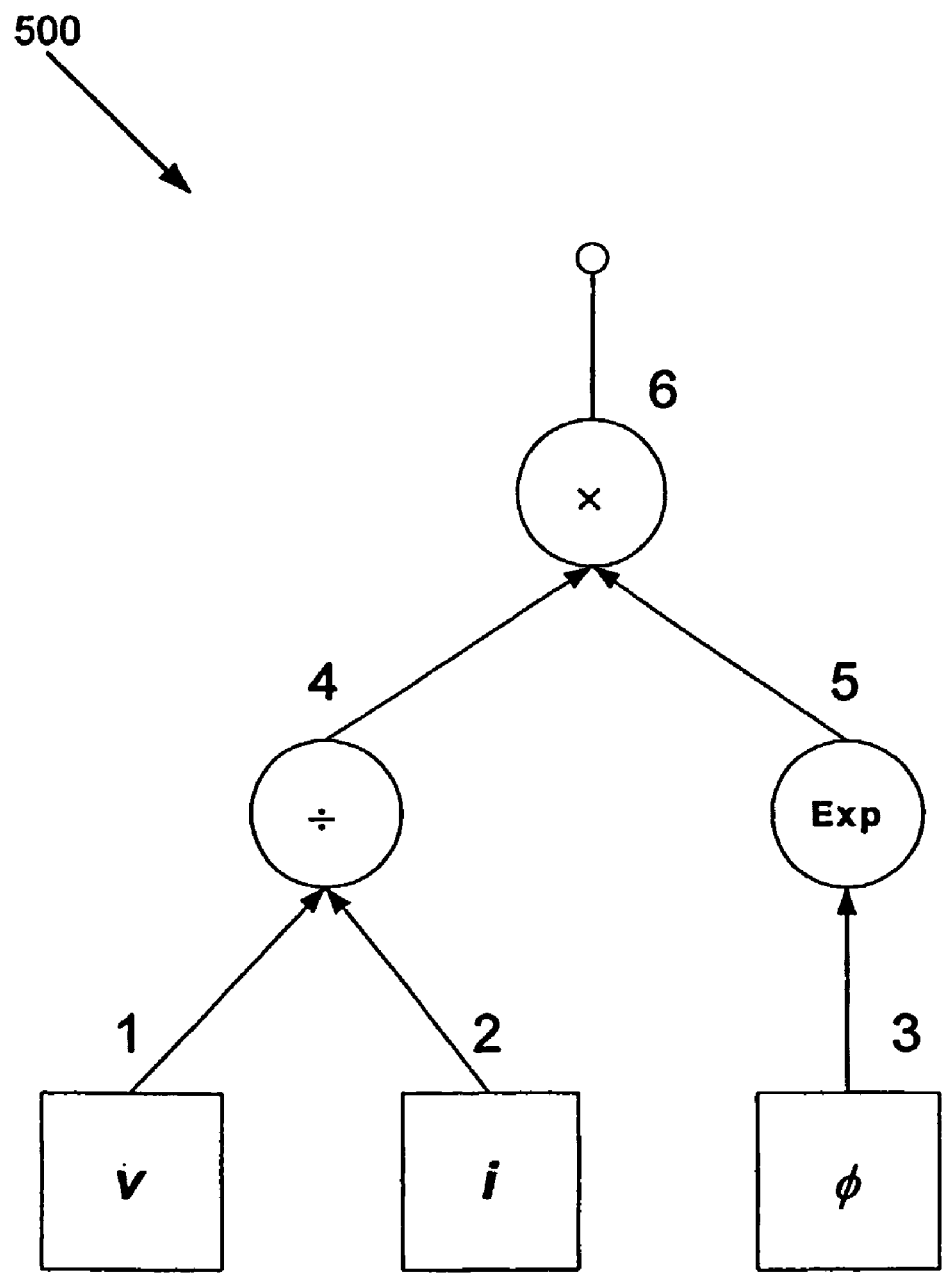
FIG. 5 shows the invention applied to the estimation of the complex-valued impedance of an electrical circuit element.

A measurement system is envisaged in a fifth preferred form as shown in FIG. 5 for the purpose of estimating the complex-valued (two-component) impedance of an electrical circuit element.

The notation used in the previous form is adopted for the two components of a complex number: the real component uses the subscript 1 and the imaginary component 2. For example, the real and imaginary components of $X_3$ are $x_{13}$ and $x_{23}$, respectively.

Measurements (estimates) are made of the complex potential across the element of interest ($x_1$), the current through it ($x_2$), and a correction term for the phase difference between the potential and current ($x_3$). The phase, $x_3$, is a pure imaginary value, so the real component of $x_3$ is zero.

The system module function for an estimate of impedance is $$x_6 = \frac{x_1}{x_2} \exp(x_3), \quad (44)$$

using the conventional definitions for complex arithmetic operations and the complex exponential function. The breakdown of modules for $x_6$ as shown at 500 yields the intermediate steps:

$$x_4 = \frac{x_1}{x_2}, \quad (45)$$

$$x_5 = \exp(x_3), \quad (46)$$

$$x_6 = x_4 x_5. \quad (47)$$

The mapping between a complex number and a matrix is defined as $$M(a + jb) \equiv \begin{bmatrix} a & -b \\ b & a \end{bmatrix} \quad (48)$$

The mapping of a complex derivative yields the Jacobian matrix $$M\left(\frac{\partial x_i}{\partial x_j}\right) = \frac{\partial x_i}{\partial x'_j}. \quad (49)$$

Therefore, the Jacobian matrices may be calculated from the corresponding complex partial derivatives, which are:

$$\frac{\partial x_4}{\partial x_1} = \frac{1}{x_2}; \quad \frac{\partial x_4}{\partial x_2} = -\frac{x_1}{x_2^2}; \quad (50)$$

$$\frac{\partial x_5}{\partial x_3} = \exp(x_3); \quad (51)$$

$$\frac{\partial x_6}{\partial x_4} = x_5; \quad \frac{\partial x_6}{\partial x_5} = x_4. \quad (52)$$

Now the uncertainty component matrices are $$U_1(x_6) = \frac{\partial x_6}{\partial x_4'} \frac{\partial x_4}{\partial x_1'} U_1(x_1) = M\left(\frac{x_5}{x_2}\right) U_1(x_1) \quad (53)$$

$$U_2(x_6) = \frac{\partial x_6}{\partial x_4'} \frac{\partial x_4}{\partial x_2'} U_2(x_2) = M\left(-\frac{x_5 x_1}{x_2^2}\right) U_2(x_2) \quad (54)$$

$$U_3(x_6) = \frac{\partial x_6}{\partial x_5'} \frac{\partial x_5}{\partial x_3'} U_3(x_3) = M(x_4 \exp(x_3)) U_3(x_3). \quad (55)$$

The matrix $U(x_6)$ combines the matrices $U_j(x_6)$, where $j=1, 2, 3$; i.e.

$$U(x_6)=[U_1(x_6) U_2(x_6) U_3(x_6)]. \quad (56)$$

In the absence of correlation, the variance-covariance matrix associated with the output is obtained as $$V(x_6)=U(x_6)U(x_6)'. \quad (57)$$

Otherwise $$V(x_6)=U(x_6)R(x_1,x_2,x_3)U(x_6)'. \quad (58)$$

Figure 6:
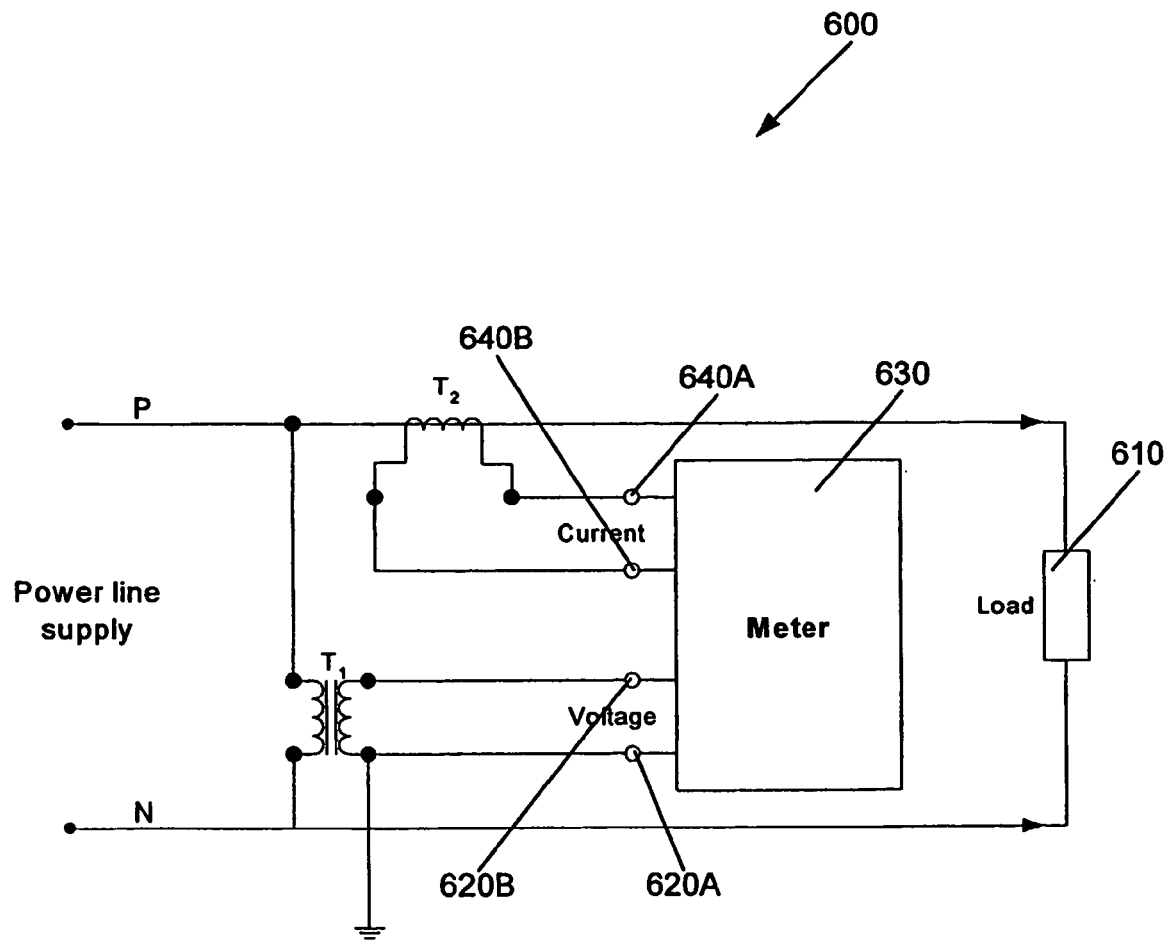
FIG. 6 shows the invention applied in the metering of energy usage for medium to large industrial sites.

In a sixth preferred form, shown in FIG. 6, the invention can be applied to the metering of energy usage for medium to large industrial sites.

FIG. 6 shows a schematic representation 600 of an energy metering installation. The installation is designed to measure the power consumption at a site, indicated by the load impedance 610.

A high line-voltage is scaled down by transformer $T_1$ and then applied to the 'Voltage' terminals 620A and 620B of meter 630. Similarly, the high line-current is scaled down by transformer $T_2$ and connected to the 'Current' terminals 640A and 640B of the meter 630.

The transformer scale factors for $T_1$ and $T_2$ vary according to the root-mean-squared (rms) operating values of voltage and current. These factors are denoted $a_1(V_{rms})$ and $a_2(I_{rms})$ for voltage and current respectively (the rms value parameters refer to the transformer secondary voltage and current). In addition, phase angle corrections may apply, denoted $p_1(V_{rms})$ and $p_2(I_{rms})$, for transformers $T_1$ and $T_2$ respectively.

A value for instantaneous active power is obtained by multiplying the instantaneous values of voltage and current, which must be estimated using the measured voltage current and phase at the meter and the correction factors.

It is assumed that the signals applied to the terminals of the meter are digitized internally and manipulated thereafter in a numerical representation, and that the meter does not otherwise contribute to phase shifts in the measurements.

An estimate of the instantaneous power is $$w_i=a_1 V_{in}(t_i)a_2 I_{in}(t_i)\cos(\theta+p_1+p_2), \quad (59)$$

where $t_i$ denotes the time of the $i^{th}$ sample, $V_{in}$ and $I_{in}$ are the instantaneous magnitudes of voltage and current presented to the meter terminals and $\theta$ is the phase angle.

An estimate of the energy consumed during the interval between two samples is $e_i=Tw_i$, where $T=t_{i+1}-t_i$ is a constant sampling period of negligible uncertainty.

The design of an energy meter, with regard to evaluating $e_i$ and its uncertainty, is now described.

The correction term pairs ($a_1$, $p_1$ and $a_2$, $p_2$) in equation (59) (and therefore in the calculation of $e_i$) are associated with the two transformers in the installation. If a transformer is changed, it may be necessary to change the associated correction term functions, a and p. Therefore, it will be assumed that the meter has been designed to allow correction routines to be installed independently and so the detailed form of the functions need not be known. However, it is assumed that for each correction term the meter software can obtain both a value (e.g. $a_1$) and an uncertainty in the value (e.g. $u_{a_1}(a_1)$).

The standard uncertainties associated with the measurement of $V_{in}$ and $I_{in}$ are denoted $u_{V_{in}}(V_{in})$ and $u_{I_{in}}(I_{in})$.

There are seven uncertain input quantities involved in the calculation of $e_i$: $a_1$, $a_2$, $p_1$, $p_2$, $V_{in}$, $I_{in}$, $\theta$. The standard uncertainties associated with these quantities are $u_{a_1}(a_1)$, $u_{a_2}(a_2)$, etc.

Decomposing the evaluation of $e_i$, the first three intermediate results obtain values for the line voltage ($x_8$), line current ($x_9$) and power factor ($x_{10}$):

$$x_8=a_1 V_{in}, \quad (60)$$

$$x_9=a_2 I_{in}, \quad (61)$$

$$x_{10}=\cos(\theta+p_1+p_2). \quad (62)$$

The product of these terms and the period T gives the energy, which becomes the $11^{th}$ and final result $$e_i=x_{11}=Tx_8 x_9 x_{10}. \quad (63)$$

The uncertainty components of the intermediate results are now given.

For line voltage, the uncertainty with respect to meter voltage is $$u_{V_{in}}(x_8)=a_1 u_{V_{in}}(V_{in}), \quad (64)$$

and with respect to transformer ratio is $$u_{a_1}(x_8)=V_{in} u_{a_1}(a_1), \quad (65)$$

For line current, the uncertainty with respect to meter voltage is $$u_{I_{in}}(x_9)=a_2 u_{I_{in}}(I_{in}), \quad (67)$$

and with respect to transformer ratio is $$u_{a_2}(x_9)=I_{in} u_{a_2}(a_2). \quad (68)$$

For the power factor correction, the uncertainty contribution from the voltage transformer is $$u_{p_1}(x_{10})=-\sin(\theta+p_1+p_2)u_{p_1}(p_1), \quad (69)$$

from the current transformer $$u_{p_2}(x_{10})=-\sin(\theta+p_1+p_2)u_{p_2}(p_2), \quad (70)$$

and from the phase $$u_\theta(x_{10})=-\sin(\theta+p_1+p_2)u_\theta(\theta). \quad (72)$$

The uncertainty components in $x_{11}$ are then $$u_{V_{in}}(x_{11})=Tx_9 x_{10} u_{V_{in}}(x_8), \quad (73)$$

$$u_{a_1}(x_{11})=Tx_9 x_{10} u_{a_1}(x_8), \quad (74)$$

$$u_{I_{in}}(x_{11})=Tx_8 x_{10} u_{I_{in}}(x_9), \quad (75)$$

$$u_{a_2}(x_{11})=Tx_8 x_{10} u_{a_2}(x_9), \quad (76)$$

$$u_{p_1}(x_{11})=Tx_8 x_{10} u_{p_1}(x_9), \quad (77)$$

$$u_{p_2}(x_{11})=Tx_8 x_9 u_{p_2}(x_{10}), \quad (78)$$

$$u_\theta(x_{11})=Tx_8 x_9 u_\theta(x_{10}). \quad (79)$$

The standard uncertainty in $e_i$ is obtained by combining these seven components in quadrature $$u_{e_i}(e_i) = \{u_{V_{in}}(x_{11})^2 + u_{a_1}(x_{11})^2$$

$$+ u_{I_{in}}(x_{11})^2 + u_{a_2}(x_{11})^2 \quad (80)$$

$$+ u_{p_1}(x_{11})^2 + u_{p_2}(x_{11})^2 + u_\theta(x_{11})^2\}^{1/2}$$

The meter will estimate the energy consumed over time by summing measurements of instantaneous power at regular intervals T. The energy consumed over a period of n intervals is then $$E = \sum_{i=1}^{n} e_i. \quad (81)$$

If independence between the $e_i$ is assumed, the standard uncertainty of the estimate, $u_E(E)$, is the root-sum-square of the standard uncertainties in the $e_i$, $$u_E(E) = \left\{ \sum_{i=1}^{n} u_{e_i}(e_i)^2 \right\}^{1/2}. \quad (82)$$

In some cases, it may be appropriate to include correlations, in which case the standard uncertainties in the $e_i$ becomes $$u_E(E) = \left\{ \sum_{i=1}^{n} \sum_{j}^{n} u_{e_i}(e_i) r_{ij} u_{e_j}(e_j) \right\}^{1/2}, \quad (83)$$

where $r_{ij}$ is the correlation coefficient between the estimates $e_i$ and $e_j$.

The description of this preferred form identifies seven input 'modules': the three subsystems that convert external analog signals to numerical values (voltage, current and phase) and the four transformer correction routines. Meter software performs the calculation of instantaneous power and uncertainty in a way that is independent of these modules, so they can be changed without requiring changes to the meter software.

In practice it is envisaged that the meter will not need to report individual uncertainty components, so a minimal module interface consisting of energy value and standard uncertainty will be sufficient in most cases. Nevertheless, the design allows the reporting of uncertainty components so that meter performance can be externally verified during testing.

Figure 7:
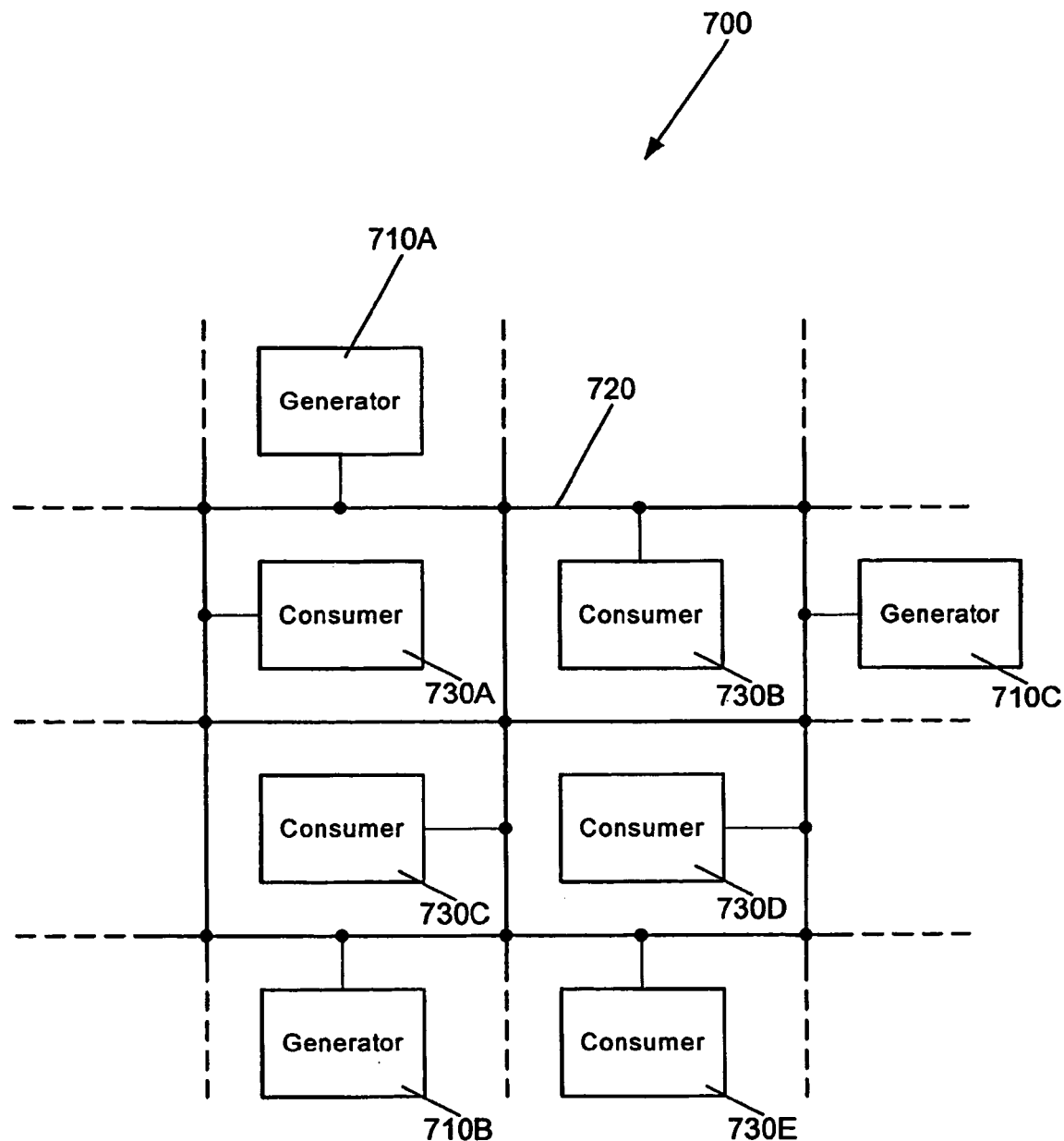
FIG. 7 shows the invention applied to the auditing of energy flows in a large power distribution system.

The invention, in a seventh preferred form as shown in FIG. 7 can be usefully applied to the problem of auditing of energy flows in a large power distribution system 700, where several power generators 710A, 710B and 710C supply electrical power to a grid 720 and a larger number of consumers 730A, 730B, 730C and 730D draw energy.

Both generators and consumers are metered. Energy meter readings are transmitted at regular intervals to a central auditing body, which will account for net energy flows in the grid and maintain accurate records of energy usage and supply. The system in this form consists of a set of modules associated with grid-user meters plus the auditing body module, which sums meter readings.

The sum of meter readings determines the net energy consumed, or generated, by a particular user. For a series of readings, $E_j$, and standard uncertainties $u_{E_j}(E_j)$ the total energy is $$E_{Tot} = \sum_j E_j$$

with a standard uncertainty of $$u_{E_{Tot}}(E_{Tot}) = \left[ \sum_j u_{E_j}(E_j)^2 \right]^{\frac{1}{2}}.$$

It may be appropriate to include correlation, in which case the standard uncertainty is $$u_{E_{Tot}}(E_{Tot}) = \left[ \sum_j \sum_k u_{E_j}(E_j) r_{jk} u_{E_k}(E_k) \right]^{\frac{1}{2}}.$$

Equations of the same form can be applied to a series of readings for any subset of grid users. In this case, the net energy flowing into and out of the grid over time is $$E_{Tot} = \sum_{ij} E_{ij}$$

with a standard uncertainty $$u_{E_{Tot}}(E_{Tot}) = \left[ \sum_{ij} u_{E_{ij}}(E_{ij})^2 \right]^{\frac{1}{2}}.$$

The subscript i identifies individual grid-user meters and j refers to the elements of the time-series of measurements from each user. As the grid has no mechanism for storing electrical energy, it is expected that the sum over all users will yield $E_{Tot}=0$, to within the uncertainty of measurement.

The accuracy of different metering installations will vary, as will the relative size of various grid users; some are large consumers or generators, some are smaller. This makes the use of energy meters with a standardized 'module' interface attractive, because the accuracy of readings from individual grid-users can be automatically taken into account. The use of uncertainties when processing data will facilitate the task of identifying and handling the kinds of 'gross' error that occur regularly in such networks. For example, erroneous meter readings arising from site configuration mistakes, missing readings, etc.

If some meters cannot provide uncertainty data, yet there is sufficient information to attribute an uncertainty to the values received, the technique can also be applied. In such cases the receiver must supplement the information obtained from the meter. Thus, it is possible that data from a heterogeneous network of 'module' and 'traditional' meters can be handled consistently with regard to uncertainty using the techniques described in this document.

In an eighth preferred form of the invention, a design pattern can be used to describe a general software solution for this class of problem. The pattern is referred to here as the "GUM-Tree".

The GUM-Tree is similar to the 'Interpreter' pattern [E. Gamma, R. Helm, R. Johnson and J. Vlissides, "*Design Patterns: Elements of reusable object-oriented software*" (Addison-Wesley, Boston, 1995)]. The pattern's main design elements (participants) are a client, a context and a set of modules.

i) The role of a client is to provide a mathematical expression involving uncertain data; a quantitative description of each uncertain datum, in terms of its value and uncertainty, and a quantitative description of correlation between data elements if appropriate. The client also invokes operations to obtain a value, and associated uncertainty, for the expression.

ii) The role of a context is to store global information needed when evaluating the expression, such as correlation coefficient values. A context may be used to coordinate operations relating to a network of modules, such as the creation of module instances, to link them together in an expression-tree, and for the calculation of standard uncertainty, etc.

iii) A module implements a standard interface, with methods for obtaining a value and uncertainty components. This interface effectively defines an abstract data-type, called here an "uncertain number".

Modules can be broadly classified into two groups: terminal and non-terminal. Terminal modules represent the input parameter data to an expression; non-terminal modules represent mathematical operations. Terminal modules are also called "leaf modules".

As a consequence of using the GUM-Tree pattern, information pertaining to every input datum's value and uncertainty is encapsulated in a leaf module. Modules, linked together in the expression-tree, propagate this information to obtain expression results. Individual modules represent steps in the evaluation of an expression and provide intermediate results, together with uncertainties. Therefore, the GUM-Tree pattern also describes the software infrastructure needed to support the uncertain-number data-type.

In the GUM-Tree pattern, a set of classes is used to define elementary module functions $f_i(\Lambda_i)$. Each class implements the behavior of the uncertain-number interface, which will include the following methods:

Value ( ), to return the module value (one iteration of equation (3));

Component (UncertainNumber), to return the uncertainty component with respect to the uncertain number referred to by 'UncertainNumber (one iteration of equation (4));

DependsOn ( ), to return the set of leaf modules that the module depends on (and hence may contribute to the uncertainty in the result).

Figure 8:
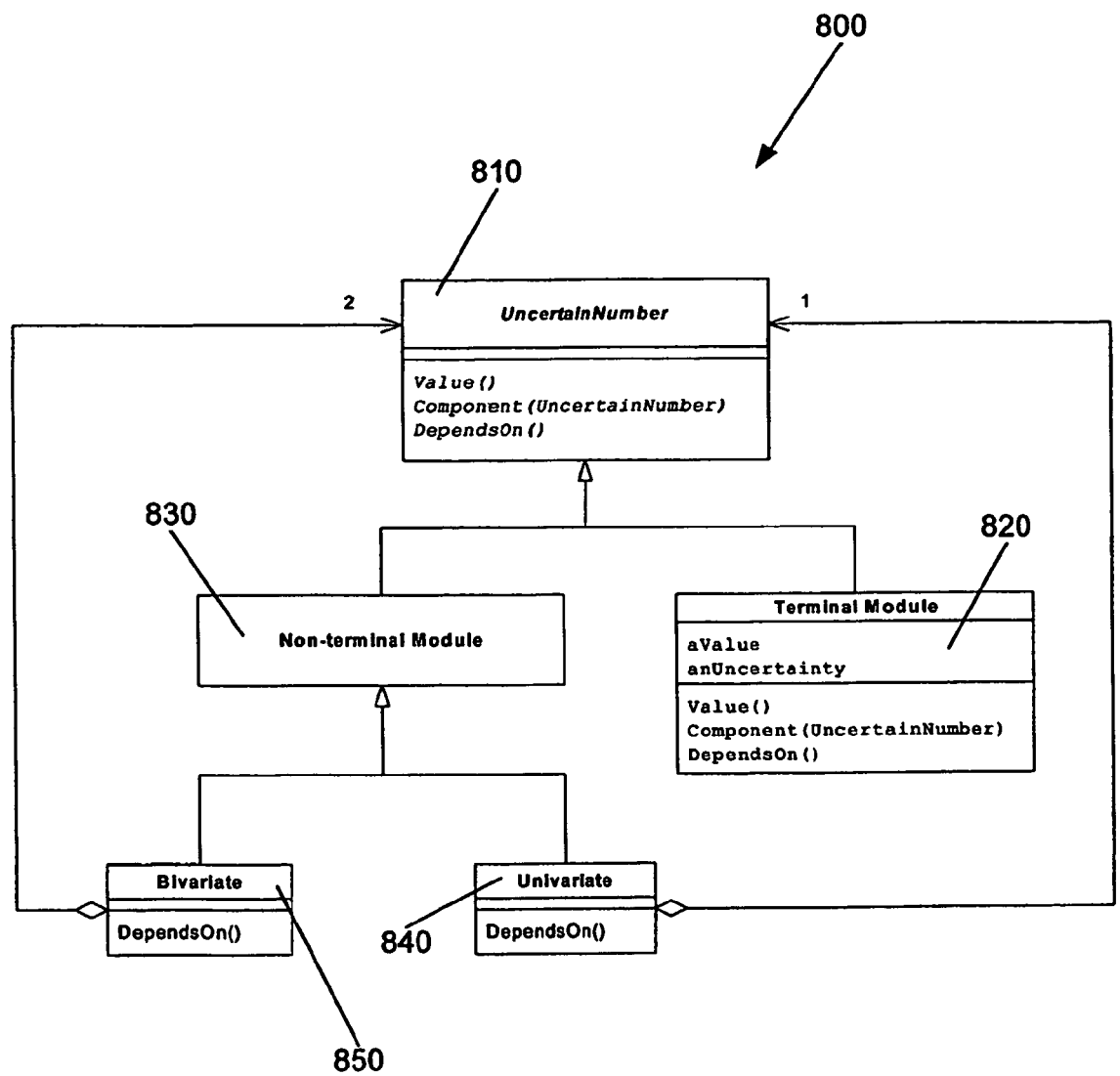
FIG. 8 shows the invention applied to a software design pattern.

FIG. 8 depicts a UML class structure diagram 800 showing the relationship of the uncertain number interface 810 to a terminal module 820 and a non-terminal module 830.

The UncertainNumber class 810 is abstract and serves to define the interface for all modules.

The two categories of module 820 and 830 are depicted as distinct classes deriving from UncertainNumber.

The Non-Terminal Module class 830 is further specialized to define classes that represent a set of mathematical operations applicable to uncertain numbers. This specialization may be facilitated further if two distinct categories of non-terminal module are defined: one for Univariate functions 840 (e.g. sin, log, etc), the other for Bivariate functions 850 (+, −, pow, etc). A non-terminal module 830 has associations (links) with other modules.

The terminal module class 820 is concrete. It encapsulates value and uncertainty information (aValue, anUncertainty).

A single class can be used to describe the context in which an expression is evaluated. Context objects are a good place to store the global information, such as correlation coefficients, $r_{jk}$, used in the calculation of standard uncertainty, for example equation (34).

Conceptually a number of functions can also be associated with a 'context' class: parsing of expressions and the assembly of expression-trees, calculation of standard uncertainty, creation of new terminal module objects, etc. Note however, the context class is not a necessary design element of the GUM-Tree pattern. In simple cases, it may be better to use global functions and variables, as is done in the implementation that follows.

C++ Implementation

The following C++ code is a concrete implementation of the GUM-Tree pattern. The listings assume the use of standard C++ libraries plus STL Port 4.5 and Boost_1_23. The code is complete and compiles on the Microsoft Visual C++ 6.0 compiler.

The code presented is a particular instance of the GUM-Tree pattern, which provides a small mathematical function library to support C++ code involving arithmetic operations with uncertain numbers.

The code is contained in three C++ header files (module.h, classes.h, helpers.h), which are presented below. A short example application then follows in which the library is used to perform a calculation related to the second preferred form.

'Module.h'

The header file 'module.h' defines the module type. The C++ structure 'Interface' is easily recognised as the UncertainNumber interface of the GUM-Tree. The 'Module' type uses a smart pointer class provided by the Boost library to simplify memory management of Module objects.

```
#include "boost/smart_ptr.hpp"
#include <set>
typedef std::set<const class Leaf*> Dependents;
struct Interface {
    virtual double fn( ) const = 0;
    virtual double uComponent(const Interface*) const = 0;
    virtual Dependents dependsOn( ) const = 0;
};
typedef boost::shared_ptr<Interface> Module;
```

'Classes.h'

The classes.h file defines the leaf module class and non-terminal classes for the four basic arithmetic operations.

```
#include <cassert>
#include "module.h"
class Leaf : public Interface {
private:
    double value_;
    double uncert_;
public:
    Leaf(double v, double u=1.0) : value_(v), uncert_(u) {}
    virtual double fn( ) const { return value_; }
```

```
        virtual double uComponent(const Interface* id) const {
            return ( id == this ) ? uncert_ : 0.0;
        }
        virtual Dependents dependsOn( ) const {
            Dependents tmp;
            if(uncert_ != 0.0) tmp.insert(this);
            return tmp;
        }
};
static inline
Dependents bivariateDependents(const Module& lhs,const Module& rhs) {
    Dependents ldep( lhs->dependsOn( ) );
    Dependents rdep = rhs->dependsOn( );
    ldep.insert(rdep.begin( ),rdep.end( ));
    return ldep;
}
class Addition : public Interface {
private:
    Module lhs;
    Module rhs;
public:
    Addition(const Module& l,const Module& r) : lhs(l), rhs(r) {}
    virtual double fn( ) const { return lhs->fn( ) + rhs->fn( ); }
    virtual double uComponent(const Interface* id) const {
        return lhs->uComponent(id) + rhs->uComponent(id);
    }
    virtual Dependents dependsOn( ) const
        return bivariateDependents(lhs,rhs);
    }
};
class Subtraction : public Interface {
private:
    Module lhs;
    Module rhs;
public:
    Subtraction(const Module& l,const Module& r) : lhs(l), rhs(r) {}
    virtual double fn( ) const { return lhs->fn( ) – rhs->fn( ); }
    virtual double uComponent(const Interface* id) const {
        return lhs->uComponent(id) – rhs->uComponent(id);
    }
    virtual Dependents dependsOn( ) const {
        return bivariateDependents(lhs,rhs);
    }
};
class Multiplication : public Interface {
private:
    Module lhs;
    Module rhs;
public:
    Multiplication(const Module& l,const Module& r) : lhs(l), rhs(r) {}
    virtual double fn( ) const { return lhs->fn( ) * rhs->fn( ); }
    virtual double uComponent(const Interface* id) const {
        return lhs->uComponent(id) * rhs->fn( ) +
            lhs->fn( ) * rhs->uComponent(id);
    }
    virtual Dependents dependsOn( ) const {
        return bivariateDependents(lhs,rhs);
    }
};
class Division : public Interface {
private:
    Module lhs;
        Module rhs;
public:
    Division(const Module& l,const Module& r) : lhs(l), rhs(r) {}
    virtual double fn( ) const {
        const double den = rhs->fn( );
        assert(den != 0.0);
        return lhs->fn( ) / den;
    }
    virtual double uComponent(const Interface* id) const {
        const double den = rhs->fn( );
        assert(den != 0.0);
        const double num =
            lhs->uComponent(id) * rhs->fn( ) –
            lhs->fn( ) * rhs->uComponent(id);
        return num / den;
    }
    virtual Dependents dependsOn( ) const {
        return bivariateDependents(lhs,rhs);
    }
};
```

Helpers.h

The helpers.h header file defines stand-alone functions that create new modules. There are functions to create instances of a constant or a variable leaf module, and to create object instances to carry out the four types of arithmetic operations defined in classes.h.

Note that the role of the functions defined here might well be implemented in other ways using a 'Context' class. For instance, an expression parser could be used. The choice of methods to go into the Context class will depend on the implementation language and the application being considered.

```
#include <cmath>
#include "classes.h"
static inline
Module leafVariable(double v,double u = 1.0) {
    return new Leaf(v,u);
}
static inline
Module leafConstant(double v) {
    return new Leaf(v,0.0);
}
static inline
Module operator+(const Module& l,const Module& r) {
    return new Addition(l,r);
}
static inline
Module operator+(double l,const Module& r) {
    Module tmp = leafConstant(l);
    return new Addition(tmp,r);
}
static inline
Module operator+(const Module& l,double r) {
    Module tmp = leafConstant(r);
    return new Addition(l,tmp);
}
static inline
Module operator–(const Module& l,const Module& r) {
    return new Subtraction(l,r);
}
static inline
Module operator–(double l,const Module& r) {
    Module tmp = leafConstant(l);
    return new Subtraction(tmp,r);
}
static inline
Module operator–(const Module& l,double r) {
    Module tmp = leafConstant(r);
    return new Subtraction(l,tmp);
}
static inline
Module operator*(const Module& l,const Module& r) {
    return new Multiplication(l,r);
}
static inline
Module operator*(double l,const Module& r) {
    Module tmp = leafConstant(l);
    return new Multiplication(tmp,r);
}
static inline
Module operator*(const Module& l,double r) {
    Module tmp = leafConstant(r);
    return new Multiplication(l,tmp);
}
static inline
Module operator/(const Module& l,const Module& r) {
```

-continued

```
        return new Division(l,r);
}
static inline
Module operator/(double l,const Module& r) {
        Module tmp = leafConstant(l);
        return new Division(tmp,r);
}
static inline
Module operator/(const Module& l,double r) {
        Module tmp = leafConstant(r);
        return new Division(l,tmp);
}
static inline
double uComnbined(Module m) {
        Dependents dep( m->dependsOn( ) );
        const Dependents::iterator last = dep.end( );
        Dependents::iterator it;
        double uc = 0.0;
        for(it = dep.begin( ); it != last; ++it) {
                uc += m->uComponent(*it) * m->uComponent(*it);
        }
        return sqrt( uc );
}
static inline
double value(Module m) { return m->fn( ); }
static inline
double uComponent(Module m,Module n) { return m->uComnponent(n);
}
```

Application to the Second Preferred Form

The following code simulates the power measurement problem described in the second preferred form. The following source code is the 'main' file of the C++ program in this case.

Note the definition of an ad hoc module class called adResistance, which encapsulates the properties of the temperature dependent resistor.

```
#include "helpers.h"
class adResistance : public Interface {
private:
        Module rValue;
public:
        adResistance(
                const Module& x2
        ,       double R0
        ,       double T0
        ,       double alpha
        )       {
                rValue = R0 * ( 1.0 + alpha * (x2 – T0 ) );
        }
        virtual double fn( ) const { return rValue->fn( ); }
        virtual double uComponent (const Interface* id) const {
                return rValue->uComponent(id);
        }
        virtual Dependents dependsOn( ) const{ return rValue->
        dependsOn( ); }
};
int main( ) {
        // Simulate sensors with leaf modules
        Module x1 = leafVariable(5,0.5); // 5 +/– 0.5 V
        Module x2 = leafVariable(25,1.0); // 25 +/– 1 degrees C
        // R0=1000 ohms, T0=20 degrees C, alpha=0.01
        Module R(new adResistance(x2,1000,20,0.01) );
        // Power equation
        Module power = x1 * x1 / R;
        cout    << "Power value = " << value(power)
                << " +/– " << uCombined(power)
                << endl
                << endl;
        cout    << "Power uncertainty wrt voltage="
                << uComponent(power,x1)
                << endl;
        cout    << "Power uncertainty wrt temperature="
                << uComponent(power,x2)
                << endl;
        return 0;
}
```

It will be appreciated that each of the algorithms described above, the equations described above and the source code described above be installed and operating on a suitable computer memory interfaced to a data processor. In particular, it is envisaged that algorithm (4) and algorithm (39) operate on a computer.

The foregoing describes the invention including preferred forms thereof. Alterations and modifications as will be obvious to those skilled in the art are intended to be incorporated within the scope hereof, as defined by the accompanying claims.

The invention claimed is:

1. An uncertainty calculation system represented as a plurality of connected modules:
   wherein each module is associated with a set of scalar-valued inputs, one scalar-valued output and one function, in which the function is configured:
      to determine the value of the output from the value of each input to the module (module-input), and
      to determine for each specific module the contribution to the uncertainty in the value of the output arising from the uncertainty in the value of any input to the system (system-input) as the sum of terms for each module-input;
   each term being the partial derivative of the module function with respect to that module-input multiplied by the contribution to the uncertainty in the value of that module-input arising from the uncertainty in the value of that system-input; and
   wherein one module has an output that represents a scalar-valued measurement result and in which the contributions to the uncertainty are combined to determine the uncertainty in the measurement result.

2. The system as claimed in claim 1 wherein the system is further configured to calculate the uncertainty in the measurement result as the standard deviation of the statistical distribution associated with the measurement result.

3. An uncertainty calculation system represented as a plurality of connected modules:
   wherein each module is associated with a set of vector-valued inputs, one vector-valued output and one function, in which the function is configured:
      to determine the value of the output from the value of each input to the module (module-input), and
      to determine for each specific module the contribution to the uncertainty in the value of the output arising from the uncertainty in the value of any input to the system (system-input) as the sum of terms for each module-input, each term being the Jacobian matrix of the module function with respect to that module-input multiplied by the contribution to the uncertainty in the value of that module-input arising from the uncertainty in the value of that system-input; and
   wherein one module has an output that represents a vector-valued measurement result and in which the contributions to the uncertainty are combined to determine the uncertainty in the measurement result.

4. The system as claimed in claim 3 wherein the system is further configured to calculate the uncertainty in the measurement result as the variance-covariance matrix of the multidimensional statistical distribution associated with the measurement result.

5. A method of calculating uncertainty in the measurement result of a measurement system represented as a plurality of connected modules, the method comprising the steps of:

associating each module with a set of scalar-valued inputs, one scalar-valued output and one function;

using the function to determine the value of the output from the value of each input to the module (module-input);

using the function to determine, for each specific module, the contribution to the uncertainty in the value of the output arising from the uncertainty in the value of any input to the system (system-input) as the sum of terms for each module-input, each term being the partial derivative of the module function with respect to that module-input multiplied by the contribution to the uncertainty in the value of that module-input arising from the uncertainty in the value of that system-input; and generating an output that represents a scalar-valued measurement result in which the contributions to the uncertainty are combined to determine the uncertainty in the measurement result.

6. The method as claimed in claim 5 further comprising the step of calculating the uncertainty in the measurement result as the standard deviation of the statistical distribution associated with the measurement result.

7. A method of calculating uncertainty in the measurement result of a measurement system represented as a plurality of connected modules, the method comprising the steps of:

associating each module with a set of vector-valued inputs, one vector-valued output and one function;

using the function to determine, for each specific module, the value of the output from the value of each input to the module (module-input);

using the function to determine the contribution to the uncertainty in the value of the output arising from the uncertainty in the value of any input to the system (system-input) as the sum of terms for each module-input; each term being the Jacobian matrix of the module function with respect to that module-input multiplied by the contribution to the uncertainty in the value of that module-input arising from the uncertainty in the value of that system-input; and generating an output that represents a vector-valued measurement result in which the contributions to the uncertainty are combined to determine the uncertainty in the measurement result.

8. The method as claimed in claim 7 further comprising the step of calculating the uncertainty in the measurement result as the variance-covariance matrix of the multidimensional statistical distribution associated with the measurement result.

* * * * *